United States Patent
Benavides

(10) Patent No.: US 6,185,098 B1
(45) Date of Patent: Feb. 6, 2001

(54) CO-LOCATION SERVER CABINET

(75) Inventor: Mark R. Benavides, Round Rock, TX (US)

(73) Assignee: Chatsworth Products, Inc., Westlake Village, CA (US)

( * ) Notice: Under 35 U.S.C. 154(b), the term of this patent shall be extended for 0 days.

(21) Appl. No.: 09/495,226

(22) Filed: Jan. 31, 2000

(51) Int. Cl.⁷ ...................................................... H05K 7/20
(52) U.S. Cl. ........................ 361/695; 361/687; 361/692; 361/724; 361/826; 361/827; 312/265.5; 312/223.1; 174/52.1; 174/35 R; 454/184
(58) Field of Search ............................ 361/683, 687, 361/692–697, 690, 684, 685, 686, 724–727, 708, 610, 827; 312/223.1, 236, 223.21, 265.5, 265.6, 257.1, 263, 265.4, 265.1, 265.2; 165/122, 124, 104.33, 126, 80.3; 454/184; 174/35 R, 35 MS, 99 R, 100, 48, 69, 24, 65 R, 58, 51, 52.1; 385/134–139; 134/15.1, 16.1; 417/360, 423.5, 423.7, 477.2; 211/41.17, 26, 182, 135, 184

(56) References Cited

U.S. PATENT DOCUMENTS

| | | | |
|---|---|---|---|
| 3,633,075 | * 1/1972 | Hawkins | 317/114 |
| 3,657,608 | * 4/1972 | Leone et al. | 317/118 |
| 4,249,227 | * 2/1981 | Kato et al. | 361/334 |
| 4,463,408 | * 7/1984 | Kleinecke et al. | 361/342 |
| 4,592,602 | * 6/1986 | Kuster et al. | 312/223 |
| 4,774,631 | * 9/1988 | Okuyama et al. | 361/384 |
| 4,901,202 | * 2/1990 | Leschinger | 361/724 |
| 5,216,579 | * 6/1993 | Basara et al. | 361/383 |
| 5,370,553 | * 12/1994 | Zimmerman | 439/534 |
| 5,528,454 | * 6/1996 | Niklos | 361/395 |
| 5,536,079 | * 7/1996 | Kostic | 312/265.3 |
| 5,544,012 | * 8/1996 | Koike | 361/695 |
| 5,788,467 | * 8/1998 | Zenitani et al. | 417/360 |
| 5,798,485 | * 8/1998 | Rohde et al. | 174/35 R |
| 5,901,033 | * 5/1999 | Crawford et al. | 361/600 |
| 6,018,465 | * 1/2000 | Young et al. | 361/684 |
| 6,044,193 | * 3/2000 | Szetesi et al. | 385/134 |
| 6,075,698 | * 6/2000 | Hogan et al. | 361/695 |

* cited by examiner

Primary Examiner—Leo P. Picard
Assistant Examiner—Michael Datskovsky
(74) Attorney, Agent, or Firm—Kennedy Covington Lobdell & Hickman, LLP

(57) ABSTRACT

A co-location server cabinet includes: an external frame having an interior; a plurality of vertically arrayed sub-cabinets, each having an internal frame mounted to the external frame and a plurality of panels mounted on the external frame, wherein at least one of the panels is a separation panel mounted between a first sub-cabinet and a second sub-cabinet; a plurality of vertically arrayed compartments, each corresponding to at least one sub-cabinet; at least one raceway mounted substantially within the interior of the external frame; and wherein each of the at least one raceway routes external cables of only one electronic component to the cabling system; and at least one fan assembly mounted within at least one of the compartments adjacent to the electronic component installed there. Each compartment, which is defined by at least some of the panels, is located in the interior of the external frame. Further, each compartment is isolated from at least one other compartment by a separation panel, and an active electronic component is installed within each compartment.

9 Claims, 6 Drawing Sheets

CO-LOCATION SERVER CABINET

FIELD OF THE INVENTION

The present invention relates generally to the field of cabinets for mounting and storing electronic components, and, more particularly, to cabinets having a plurality of separable, vertically arrayed, interior compartments for separately mounting and storing electronic components.

BACKGROUND OF THE INVENTION

Frames and cabinets for mounting and storing electronic components have been well known for many years. Frames are typically simple rectangular frameworks on which electronic components may be mounted, or on which other mounting members, such as shelves or brackets, may be mounted which in turn may support the electronic components. Cabinets are typically frames on which panels or doors, or both, are hung to provide aesthetic improvement, to protect the components from external influences, to provide security for the components stored inside, or for other reasons.

Frames and cabinets have been built in many different sizes and with many different proportions in order to best accommodate the components which they are designed to store. Large frames and cabinets have been created to hold large components or to hold multiple components. Smaller frames and cabinets are more commonly utilized for smaller components.

Components stored in these frames and cabinets may include audio and video equipment and the like, but quite frequently include computer equipment and related peripheral devices. Regardless of the component type, each component typically requires an external power supply and a plurality of input and output wires and cables. Some of these wires and cable are connected to other components in the same frame or cabinet, and some of which extend out of the frame or cabinet to either an adjacent frame or to a remote location, typically using either an overhead cabling system or an under-floor cabling system.

Typically, large computer installations are contained entirely within one room in a building. The installation facility, which commonly includes the room and everything in it, is typically under the control of a single entity, which oversees such operational details as the design of the installation, the physical installment process, the day-to-day operation of the installation, service and maintenance for the computers in the installation, the environmental characteristics of the room, security for the room, and many other details. Thus, that single entity has the ability and the authority to install and arrange frames or cabinets at the installation facility however desired. Moreover, the same entity has the ability and authority to install and arrange the computers within those frames however desired. Among other things, this allows the entity to minimize the number of frames by utilizing the largest size frame that will fit within the room and by installing as many components within each frame, if so desired.

With the advent of the internet, however, a very different type of installation facility has been developed. It is well known that the operation of the internet requires the joint efforts of thousands or tens of thousands of specialized computers commonly known as "servers." Servers are used to communicate data from one point to another in the "world wide web." In order to facilitate computer operators in millions of locations around the world to access the web, the servers must be stationed in thousands of different physical locations, which therefore require thousands of installation facilities. Unfortunately, each installation facility requires a certain amount of space, staff personnel to oversee operation, sufficient environmental controls including sufficient heating and air conditioning equipment, and many other necessities. Therefore, each separate installation facility bears a significant amount of overhead cost, the effect of which cannot be avoided through economies of scale. In addition, a high-speed data path must be provided between each server and some kind of central office switch in order to provide connectivity between the server and the internet backbone. Together, these factors impose significant costs on any entity seeking to build a network of servers. As a result, installation facilities have been developed in which one entity, or "host," provides proximity to a central office switch, floor-space, temperature control, power supply, and other general operational requirements to a multiplicity of tenant network server owners. Each server owner controls one or more individual server within the facility, sharing the overhead costs with other owners of servers co-located in the same facility in order to achieve economies of scale with regard to the general operational infrastructure described above.

Unfortunately, individual servers in such a facility are typically installed within a single room. Thus, any co-located server owner who visits the facility in order to access his servers is also able to access servers belonging to other owners. Whether this intrusion is unintentional on the part of an owner, or in a worse scenario, intentional, any owner has the ability, at a minimum, to inadvertently observe or deduce information about his competitors' equipment merely by looking at it, to physically access the equipment temporarily to determine detailed technical information about it, or, in unusual cases, to physically tamper with the equipment in order to cause damage or to spy on its operation. As a result, precautions must be taken in order to prevent such unauthorized access by one owner to equipment belonging to another owner.

In one solution to the aforementioned problems, access to the facility may be limited to times when such access can be supervised by the host of the facility. Unfortunately, it is much more desirable to be able to access the equipment at any time, particularly in order to provide emergency service to equipment which has failed suddenly and unexpectedly, but the cost to the host of providing sufficient staff to ensure continuous availability to the facility is typically prohibitive. In addition, unless the equipment is stored within a cabinet, unauthorized visual access to other owners' servers is still available to any owner entering the facility.

In another solution to the aforementioned problems, security may be provided by installing each server in a separate, securable cabinet. In such an installation, an owner may enter the room and access his equipment at any time, but is unable to physically access other owners' equipment when that equipment is secured within a cabinet. Visual access may also be limited by utilizing opaque panels which prevent unauthorized personnel from viewing equipment contained within a cabinet. Unfortunately, server equipment typically does not require a full-height frame; i.e., one which extends to the height of the ceiling, or to the highest point generally accessible by service personnel. As a result, servers are commonly mounted in separate cabinets which are lined up adjacent to each other in the room or rooms at the installation facility. However, this solution greatly reduces the number of co-located servers that can be located in a given floor space, thereby greatly reducing the lease income return on investment available to the co-location facility host.

Alternatively, the space available within a room may be more effectively utilized by mounting individual cabinets on the walls of the room. Thus, a server may be stored in one or more wall-mounted cabinet which is located directly above a standard cabinet resting on the floor. However, such a solution may only be utilized around the perimeter of the room. In addition, such a solution has no provision for managing the cabling required to route cables and wires to or from adjacent cabinets and to or from overhead or under-floor cabling systems. Further, each discrete cabinet carries a relatively similar cost in materials, and wall-mounted cabinets are typically more difficult to install than standard floor-mounted cabinets. Thus, a need exists for a co-location server cabinet in which individual, securable compartments are arrayed vertically in a single structure which prevents unauthorized visual or physical access to the servers stored in the compartments.

It has also been well known for many years that active network and electronic components and systems generate heat. Some equipment will fail and other equipment will operate well below optimum performance levels when that equipment exceeds maximum temperature limits. For this reason, many electronic components contain fans to disperse heat generated within the components. However, the fans alone may not adequately protect a particular component for many reasons. The fans can fail while the equipment continues to operate and to generate heat. The fans utilized are necessarily small enough to fit within the component, and thus may not be adequate to exhaust hot air from within the component frequently enough to maintain a suitable operating temperature. There may also be additional equipment within the same cabinet which generates additional heat beyond the environmental characteristics required by the fan. For these reasons and others, back-up or auxiliary thermal management systems are often required.

One part of any auxiliary thermal management system is the provision of adequate passive ventilation around the components. Components installed in cabinets are particularly susceptible to overheating because of their enclosed nature, and thus, cabinets are commonly provided with a plurality of venting apparatuses in order to allow heated air to escape. However, cabinets and frames alike frequently need additional assistance to disperse heat properly. For this reason, active ventilation systems such as additional fans are commonly employed to exhaust heated air from the space around the equipment mounted in a frame or cabinet.

In one well known solution to the aforementioned problems, one or more top-mounted fans may be mounted on the top of the frame or cabinet. In a frame or cabinet having a top panel covering the top of the frame, the fans are commonly positioned over one or more corresponding vents in the top panel. Activation of the fans may then create an upward draft, causing heated air to rise from near the bottom of the interior of the cabinet toward the top of the interior and, from there, out through the vents in the top panel.

Unfortunately, in a cabinet having multiple, separable interior compartments arrayed vertically within the cabinet, such as might be suitable for co-locating multiple server computers as described above, the compartments must necessarily be partitioned from each other. These partitions may be likely to impede the smooth flow of air from the bottom of the interior of the cabinet to the top and may thus result in unexpected overheating of the components stored within. Further, the amount of space available for a solution to such a problem is severely limited by the volume requirements of the components mounted in the compartments. Thus, a need exists for a compact, active thermal management system for exhausting heated air from within the interior of each compartment in a vertically arrayed co-location server cabinet.

SUMMARY OF THE INVENTION

Briefly described, the present invention includes a co-location electronic network component cabinet for securely storing a plurality of active electronic components in isolation from each other, the cabinet being adjacent to a cabling system, and each electronic component having external cables, wherein the cabinet includes an external frame having an interior; a plurality of panels mounted on the external frame; and a plurality of vertically arrayed compartments, each compartment being located in the interior of the external frame, and each compartment being defined by at least some of the panels.

In a feature of the cabinet of the present invention, the cabinet also includes at least one raceway mounted substantially within the interior of the external frame, and one such raceway routes external cables from only a first electronic component toward the cabling system. In another feature of the present invention, the raceway includes at least one access opening for communicatively connecting the raceway to a first compartment of the plurality of compartments. In another feature of the present invention, two or more raceways may be used for different electronic components or compartments.

The present invention also includes a co-location electronic network component cabinet for storing a plurality of active electronic components adjacent to a cabling system, the cabinet including an external frame, the frame having an interior; a plurality of vertically arrayed sub-cabinets, wherein each sub-cabinet comprises an internal frame mounted to the external frame, and at least one door; at least one separation panel mounted between a first sub-cabinet and a second sub-cabinet; and at least one raceway mounted substantially within the interior of the external frame, wherein a first raceway of the at least one raceway routes external cables of only a first electronic component toward the cabling system. In a feature of the cabinet of the present invention, the cabinet may comprise at least a second raceway which routes external cables of only a second electronic component toward the cabling system.

The present invention also includes a co-location electronic network component cabinet for providing auxiliary thermal management for a plurality of active electronic components, the electronic components being installed within the cabinet, the cabinet including an external frame having an interior; a plurality of panels, including at least one separation panel, mounted on the external frame; a plurality of vertically arrayed compartments, as defined by at least some of the plurality of panels, located in the interior of the external frame, wherein each compartment is isolated from at least one other compartment by a separation panel, and wherein an active electronic component is installed within each compartment; and a fan assembly mounted within at least one of the compartments, adjacent to the electronic component installed within that compartment. In a feature of the cabinet of the present invention, the mounting panel is mounted at the rear of the first compartment. In another feature of the present invention, the number of fan assemblies is at least equal to the number of compartments, and at least one fan assembly is mounted within each compartment adjacent to the electronic component.

The present invention also includes a fan assembly for providing auxiliary thermal management for a electronic component cabinet which holds a plurality of electronic components mounted on at least one internal frame, each component being isolated in a separate compartment within the cabinet, the fan assembly including a mounting panel attached to the internal frame in a first compartment, the mounting panel having at least a first side; and a fan attached to the first side of the mounting panel. In a feature of the fan assembly of the present invention, the fan assembly further comprises a power strip having at least one outlet, capable of accepting the plug end of a power supply cable, mounted to the mounting panel, wherein the fan comprises a power supply cable having a plug end for plugging into a power outlet in the power strip. In another feature of the present invention, the mounting panel has a first side on which the power strip and the fan are mounted. In another feature, the first side of the mounting panel faces the rear of the electronic component isolated in the first compartment. In another feature of the present invention, the mounting panel also includes a power strip supply cable retention assembly.

The present invention also includes a co-location electronic network component cabinet for storing a plurality of active electronic components, having external cables, adjacent to a cabling system, wherein the cabinet includes an external frame having an interior; a plurality of vertically arrayed sub-cabinets, each of which includes an internal frame mounted to the external frame and a plurality of panels mounted on the external frame, wherein at least one of the panels is a separation panel mounted between a first sub-cabinet and a second sub-cabinet; a plurality of vertically arrayed compartments, as defined by at least some of the plurality of panels, located in the interior of the external frame, wherein each compartment corresponds to at least one sub-cabinet, wherein each compartment is isolated from at least one other compartment by a separation panel, and wherein an active electronic component is installed within each compartment; at least one raceway, mounted substantially within the interior of the external frame, which routes external cables of only one electronic component to the cabling system; and at least one fan assembly mounted within at least a first compartment of the plurality of compartments, adjacent to the electronic component installed within the compartment.

Further features and advantages of the present invention will become apparent upon reading and understanding this specification, taken in conjunction with the accompanying drawings.

DETAILED DESCRIPTION OF THE PREFERRED EMBODIMENTS

Before describing the details of the present invention, it will be appreciated that directional terms such as "right," "left," "top," "bottom, " "front" and "rear" are used herein to aid in the understanding of the present invention by describing relative directions and locations, and their use herein and in the claims hereof is not intended in any way to be limiting.

Figure 1:
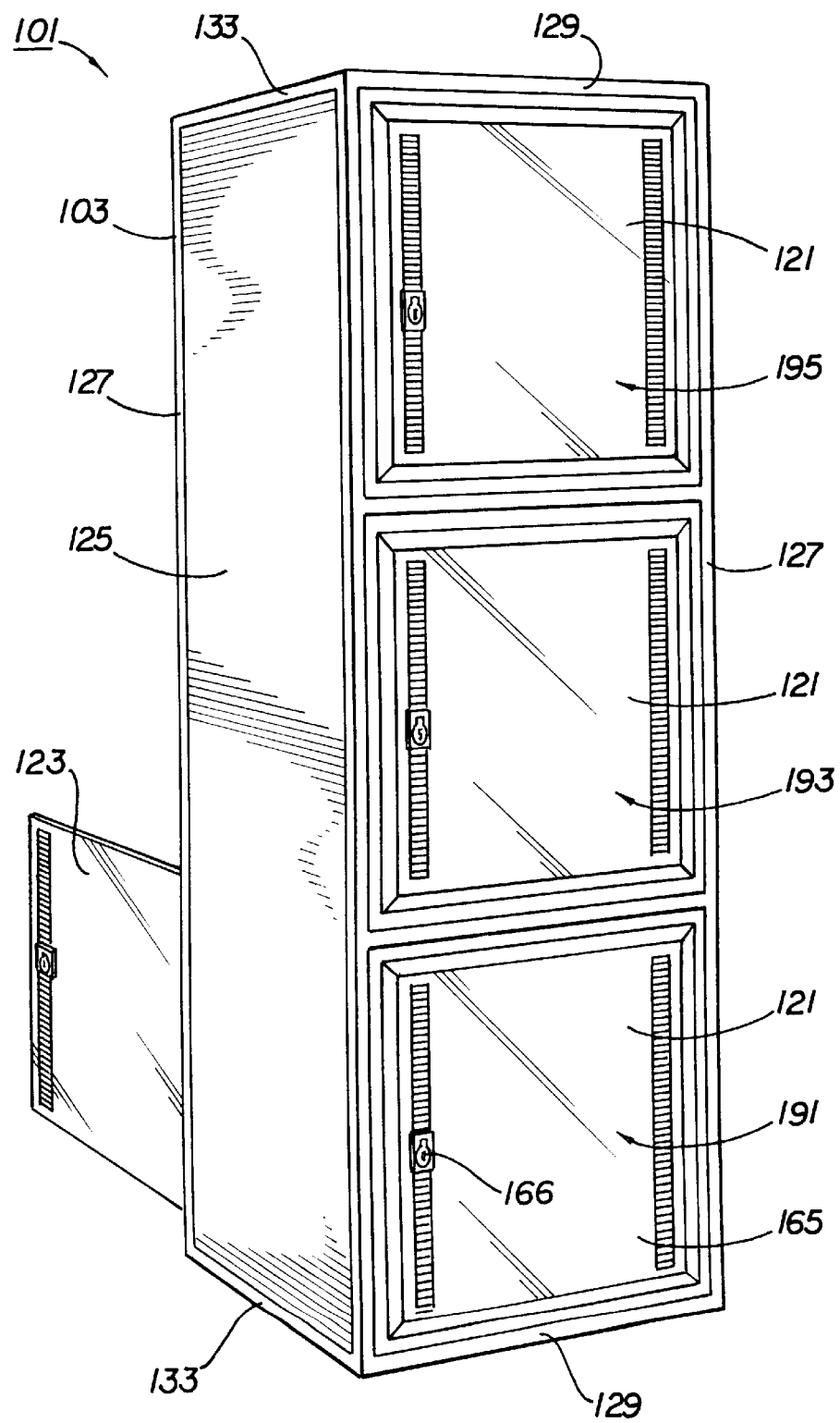
FIG. 1 is a perspective view of a cabinet in accordance with preferred embodiments of the present invention.

Referring now to the drawings, in which like numerals represent like components throughout the several views, a co-location server cabinet 101, in accordance with the preferred embodiments of the present invention, is shown in FIG. 1. As shown and described, the co-location server cabinet 101 includes an external frame 103, a plurality of internal frames 105, 106, 107, a plurality of separation panels 109, 111, a top panel 113, a pair of vertical raceways 115, 117, a plurality of front doors 121, a plurality of rear doors 123 and a pair of side panels 125. The external frame 103 comprises four vertical members 127, upper and lower front cross members 129, upper and lower rear cross members 131 and two pairs of upper and lower side cross members 133.

Figure 2:
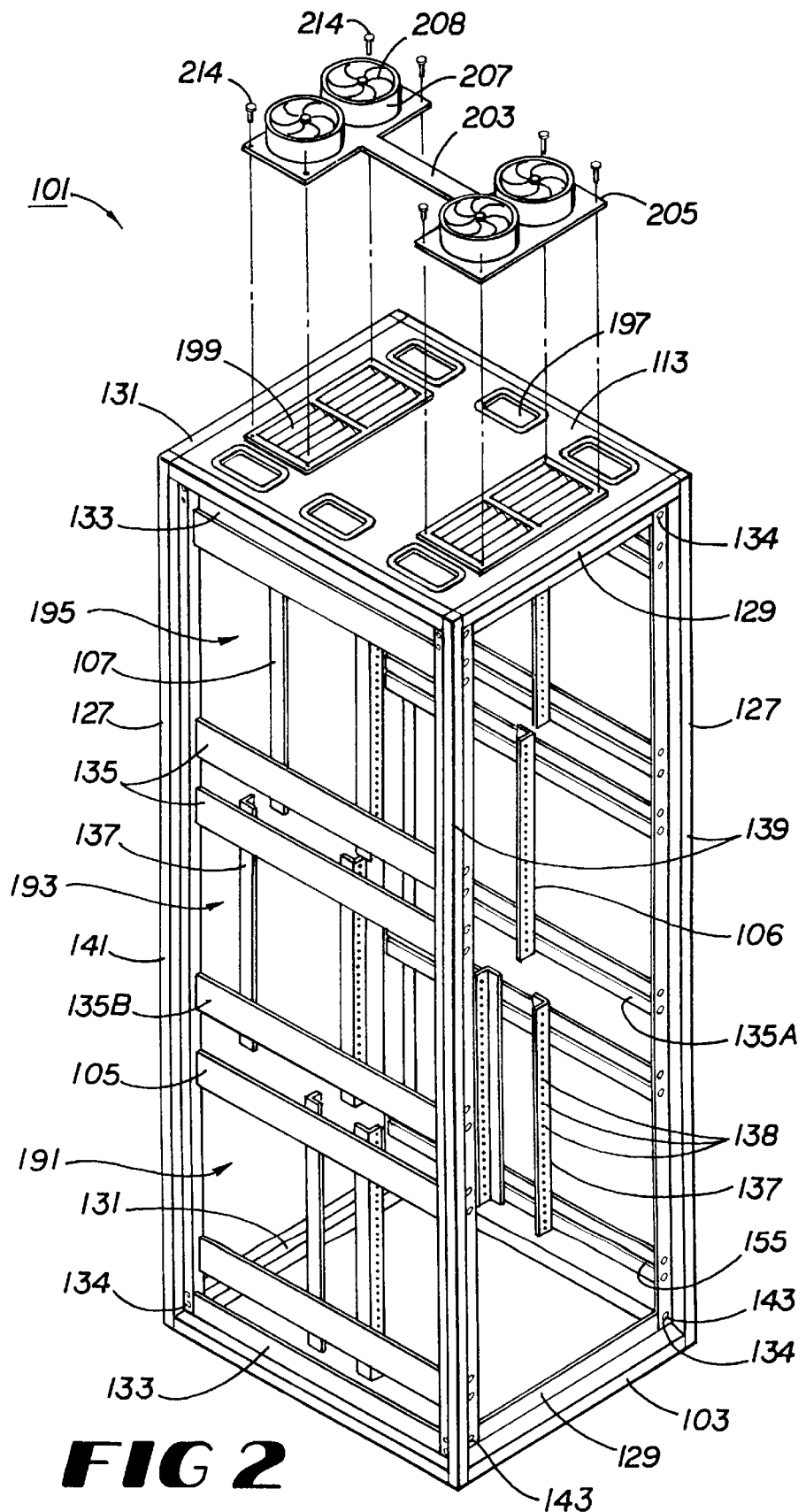
FIG. 2 is a perspective view of the major components of the external and internal frames of a preferred embodiment of the cabinet of FIG. 1.
Figure 3:
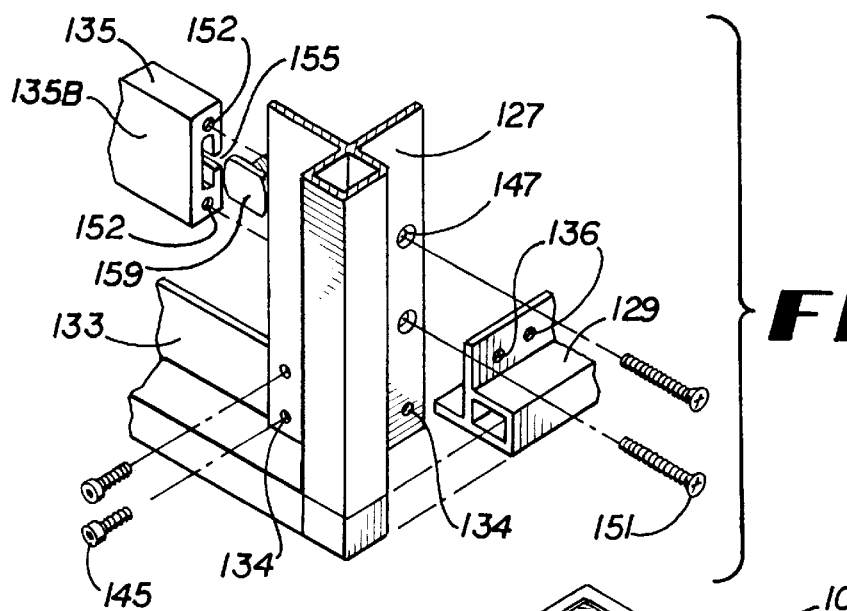
FIG. 3 is a partially exploded fragmentary perspective view of the details of one corner of the external frame of FIG. 2.

FIG. 2 is a perspective view of the major components of the external and internal frames of the cabinet of FIG. 1. Each vertical member 127 comprises a plurality of cross member attachment apertures 134 at each end. Each cross member 129, 131, 133 has two corresponding apertures 136 at each end. Thus, as perhaps best shown in FIG. 3, two of the vertical members 127 are connected together at their upper and lower ends by the upper and lower front cross members 129, respectively, by inserting a fastener 143 through each front cross member attachment aperture 134 and the corresponding aperture 136 in the respective front cross member. Similarly, the other two vertical members 127 are connected together at their upper and lower ends by the upper and lower rear cross members 131, respectively, by inserting a fastener 143 through each rear cross member attachment aperture 134 and the corresponding aperture 136 in the respective rear cross member. The front cross members 129 and their respective vertical members 127 thus define a front frame 139, and the rear cross members 131 and their respective vertical members 127 define a rear frames 141. The front and rear frames 139, 141 may then be connected together at their respective corners by the upper and lower side cross members 133 by inserting a fastener 145 through each side cross member attachment aperture 134 and the corresponding aperture 136 in the respective side cross member 133. In a preferred embodiment, each type of fastener 143, 145 is a threaded bolt, and may be secured by a respective hexagonal nut and washer combination. Together, the front and rear frames 139, 141 and the upper and lower side cross members 133 thus form the external frame 103 defining a front, a rear, a top, a bottom, a right side and a left side.

Preferably, the precision and the stability of each of the corners of the external mounting frame 103 may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

Each internal frame 105, 106, 107 comprises four horizontal mounting rails 135 and at least four vertical mounting rails 137. Thus, in a cabinet 101 having three internal frames 105, 106, 107, there are a total of twelve horizontal mounting rails 135. As perhaps best shown in FIG. 3, each horizontal mounting rail 135 comprises an inboard side 135A, an outboard side 135B and a pair of threaded openings 152 at its end. In addition, each vertical member 127 of the external frame 103 further comprises six pairs of mounting apertures 147, all of which are located intermediate the cross member attachment apertures 134. The two vertical members 127 defining the right side of the external frame may be connected together by six horizontal mounting rails 135 by inserting a fastener 151 through each mounting aperture 147 and each of the corresponding threaded openings 152 in the ends of each horizontal mounting rail 135. Similarly, the two vertical members 127 defining the left side of the external frame may be connected together by the other six horizontal mounting rails 135 by inserting a fastener 151 through each mounting aperture 147 and each of the corresponding threaded openings 152 in the ends of each horizontal mounting rail 135.

The inboard side 135A of each horizontal mounting rail 135 comprises a longitudinal grooved recess 155 having a T-shaped cross-section. In addition, each vertical mounting rail 137 comprises two corresponding apertures (not shown) near each end. A pair of fasteners 159, such as threaded bolts, may be inserted into the inboard grooved recess 155 of each horizontal mounting rail 135 such that the heads of the bolts reside in the grooved recess 155 and the threaded ends protrude from the inboard side 135A of the rail 135. Once inserted, each fastener 159 may be adjusted longitudinally to a desired location along the length of the rail 135. The two horizontal mounting rails 135 of the first internal frame 105 which are adjacent to the right side of the external frame 103 may be connected together by inserting each of the fasteners 159 which reside in the horizontal mounting rail grooved recess 155 through a corresponding aperture in the respective vertical mounting rail 137. Similarly, the two horizontal mounting rails 135 of the first internal frame 105 which are adjacent to the left side of the external frame 103 may be connected together by inserting each of the fasteners 159 which reside in the horizontal mounting rail grooved recess 155 through a corresponding aperture in the respective vertical mounting rail 137. The lateral position of the vertical mounting rails 137 relative to the external frame 103 may be adjusted by longitudinally sliding the fasteners 159, and hence the ends of the vertical mounting rails 137, along the grooved recesses 155 of the horizontal mounting rails 135. Each of the fasteners 159 may then be secured by a hexagonal nut and washer combination (not shown).

Together, the horizontal mounting rails 135 of the first internal frame 105 which are adjacent to the sides of the external frame 103 and the vertical mounting rails 137 connecting the horizontal mounting rails 135 together thus form the first internal frame 105 defining a front, a rear, a top, a bottom, a right side and a left side. Similarly, the two horizontal mounting rails 135 and the two or more vertical mounting rails 137 of the second internal frame 106 are connected to each other, and to the vertical members 127 of the external frame 103, in the same manner to form the second internal frame 106, defining a front, a rear, a top, a bottom, a right side and a left side. Finally, the two horizontal mounting rails 135 and the two or more vertical mounting rails 137 of the third internal frame 107 are connected to each other, and to the vertical members 127 of the external frame 103, in the same manner to form the second internal frame 107, defining a front, a rear, a top, a bottom, a right side and a left side. Each vertical mounting rail 137 comprises a series of evenly-spaced, threaded mounting apertures 138, extending along substantially the entire length of the rail, for use in mounting electronic components, peripheral devices, cable brackets, additional mounting members, or the like.

The front doors 121 and the rear doors 123 each comprise a door panel 165 which may be attached directly to the cabinet's external frame 103 by a hinge assembly (not shown), the design and construction of which should be obvious to one of ordinary skill in the art. The front and rear door panels 165 are vertically arrayed on the front and rear sides, respectively, of the external frame 103 such that each front and rear door 121, 123 is positioned adjacent a particular internal frame 105, 106, 107.

Alternatively, the front doors 121 and rear doors 123 may each comprise a door frame (not shown) and a door panel 165. Each door panel 165 may be attached to its respective door frame (not shown) by a hinge assembly (not shown), the design and construction of which should be obvious to one of ordinary skill in the art. The front and rear door frames are vertically arrayed on the front and rear sides, respectively, of the external frame 103 such that each front and rear door 121, 123 is positioned adjacent a particular internal frame 105, 106, 107. The door frames may be attached to the external frame 103 via suitable fasteners.

Preferably, each door panel 165, either by itself or in combination with its respective door frame, where applicable, may be installed so that it opens to the left, or installed so that it opens to the right, as desired. The design and construction of such a feature should be well known to one of ordinary skill in the art. Also preferably, the door panels 165 are formed from a translucent or opaque material to prevent visual access to the cabinet, and include means for ventilating the interior, such as perforations or louvers.

The side panels 125 are also formed from a translucent or opaque material. The side panels 125 may be attached to the sides of the external frame 103 via suitable fasteners.

Together, the first internal frame 105 and its respective front and rear doors 121, 123 form a first sub-cabinet 191. Similarly, the second internal frame 106 and its respective front and rear doors 121, 123 form a second sub-cabinet 193, and the third internal frame 107 and its respective front and rear doors 121, 123 form a third sub-cabinet 195.

As shown, the present invention comprises three sub-cabinets 191, 193, 195 of the type described above, but it should be obvious to one of ordinary skill in the art that the present invention may be adapted to any reasonable number of sub-cabinets. In addition, it should be obvious to one of ordinary skill in the art that, alternatively, separate cabinets may be constructed using the principles of the present invention and then combined together using suitable fasteners.

The three sub-cabinets 191, 193, 195 are arrayed vertically such that the first sub-cabinet 191 is positioned on the bottom, the second sub-cabinet 193 is positioned above the first sub-cabinet 191, and the third sub-cabinet 195 is positioned above the second sub-cabinet 193. The interior of the first sub-cabinet 191 is separated from the interior of the second sub-cabinet 193 by the first separation panel 109, which substantially covers the top of the first sub-cabinet 191 and the bottom of the second sub-cabinet 193. Similarly, the interior of the second sub-cabinet 193 is separated from the interior of the third sub-cabinet 195 by the second separation panel 111, which substantially covers the top of the second sub-cabinet 105 and the bottom of the third sub-cabinet 107. Finally, the top of the third sub-cabinet 195 is substantially covered by the top panel 113.

Figure 4:
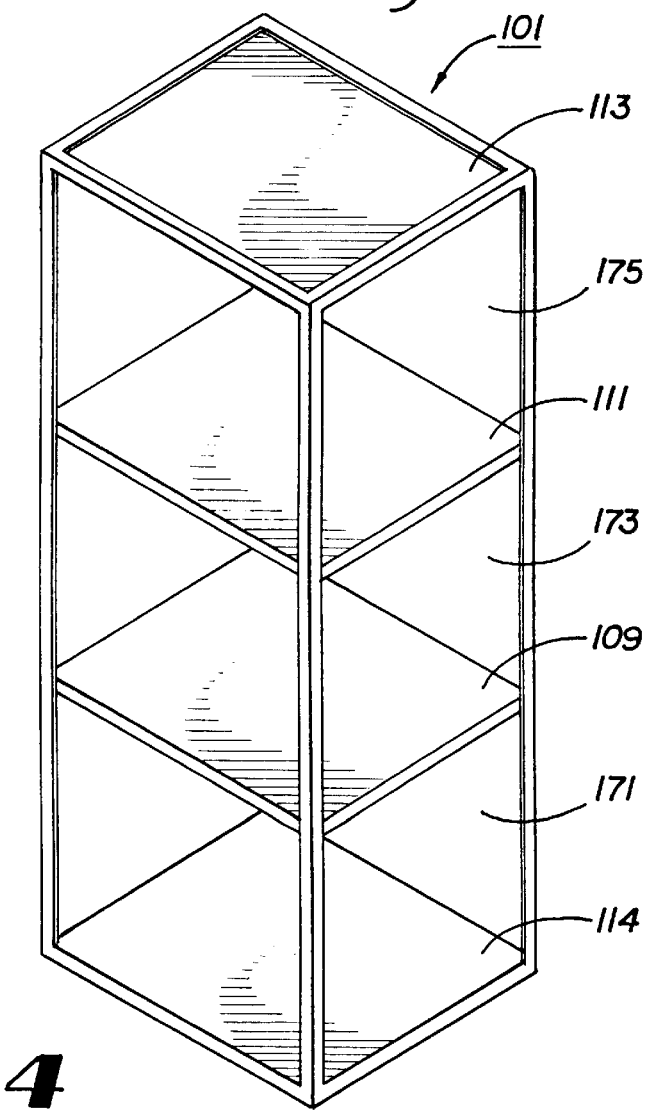
FIG. 4 is a schematic view of the cabinet of FIG. 1 illustrating the relationship of the compartments of the cabinet to portions of the external and internal frames.

FIG. 4 is a schematic view of the cabinet of FIG. 1 illustrating the relationship of the compartments of the cabinet to portions of the external and internal frames. The space surrounded by the cabinet side panels 125, the first sub-cabinet front and rear doors 121, 123, the first separation panel 109 and the floor underneath the first sub-cabinet defines a first compartment 171. Similarly, the space surrounded by the cabinet side panels 125, the second sub-cabinet front and rear doors 121, 123, the second separation panel 111 and the first separation panel 109 defines a second compartment 173. Finally, the space surrounded by the cabinet side panels 125, the third sub-cabinet front and rear doors 121, 123, the top panel 113 and the second separation panel 111 defines a third compartment 175.

Figure 5:
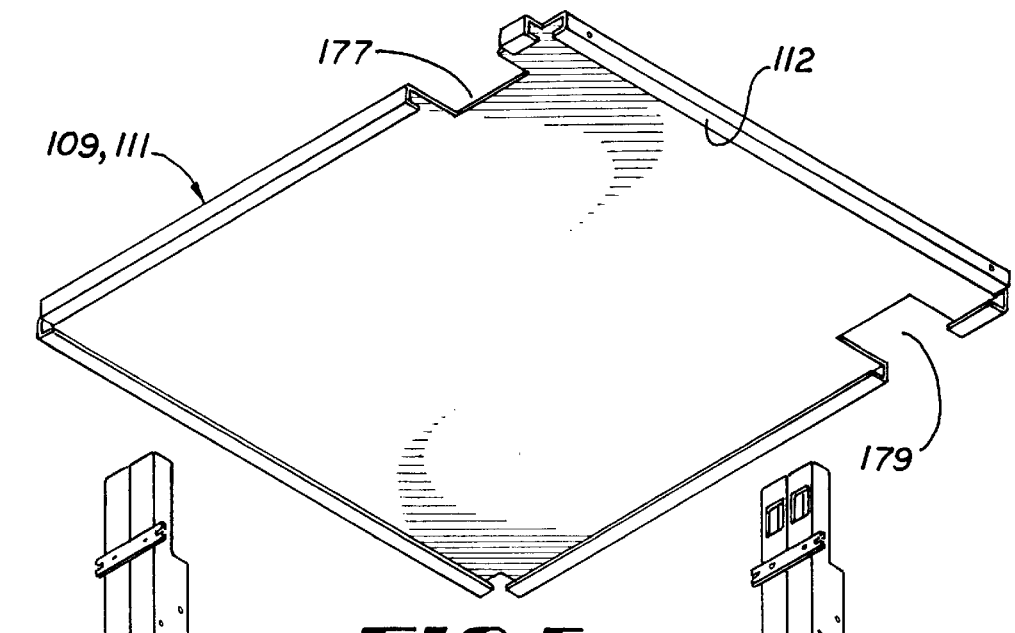
FIG. 5 is a perspective bottom view of a separation panel suitable for use in accordance with the preferred embodiments of the present invention.

FIG. 5 is a perspective bottom view of a separation panel suitable for use in accordance with the preferred embodiments of the present invention. Each separation panel 109, 111 comprises a sheet of metal which may be perforated to permit ventilation between adjacent compartments 171, 173, 175, and which has a pair of recesses 177, 179 in opposite edges of the separation panels 109, 111. However, for still greater security, the separation panels may comprise a solid, non-perforated and non-ventilated panel. In one preferred embodiment, each of the separation panel edges is bent downward and inward to form a lip 112 to provide additional strength to the separation panel edge, and the first and second separation panels 109, 111 may be mounted in the bottom of the second and third sub-cabinets 106, 107, respectively, via suitable fasteners (not shown). However, it should be obvious to one of ordinary skill in the art that the construction and installation of the separation panels 109, 111 may be varied considerably without exceeding the scope of the present invention. Also preferably, the separation panels 109, 111 are oriented so that the recesses 177, 179 of each separation panel 109, 111 are located near the rear of the cabinet 101. However, the separation panels 109, 111 may alternatively be oriented so that the recesses 177, 179 of each separation panel 109, 111 are located near the front of the cabinet 101. However, the recesses 177, 179 must be installed so that the first recess 177 of the second separation panel 111 is located directly above the first recess 177 of the first separation panel 109, and so that the second recess 179 of the second separation panel 111 is located directly above the second recess 179 of the first separation panel 109.

Figure 6:
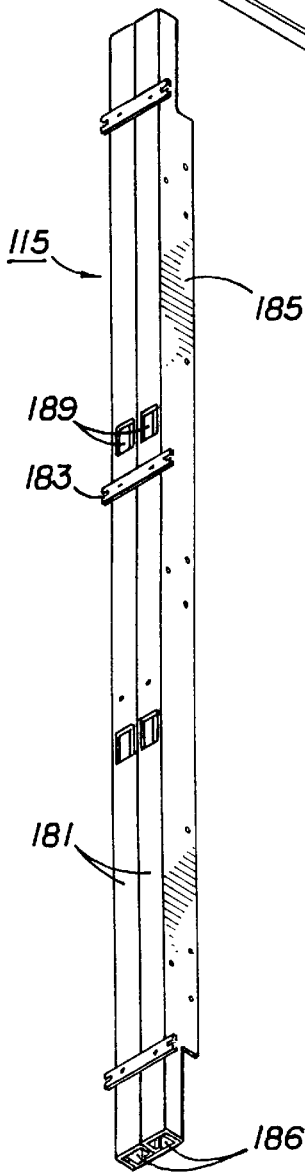
FIG. 6 is a perspective view of a first vertical raceway suitable for use in accordance with the preferred embodiments of the present invention.
Figure 7:
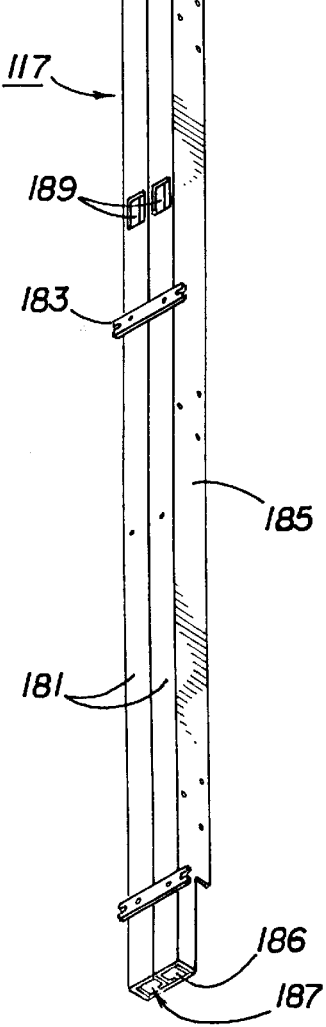
FIG. 7 is a perspective view of a second vertical raceway suitable for use in accordance with the preferred embodiments of the present invention.

FIGS. 6 and 7 are perspective views of first and second vertical raceways 115, 117 suitable for use in accordance with the preferred embodiments of the present invention. Each vertical raceway 115, 117 comprises a pair of tubular members 181, a plurality of mounting brackets 183 and a pair of elongated cabling flanges 185. Each hollow, open-ended tubular member 181 is formed from one or more sheet of metal into a tube having a generally rectangular cross-section. Each tube thus defines a pair of open ends 186 and a hollow core 187. Each tube member 181 further includes a pair of access openings 189 located on one side of the tube, intermediate the tube ends 186, which provide communicative access to the tube's hollow core 187. Preferably, the access openings 189 are formed to have a similar size and shape to the tube's open ends 186. The two tubular members 181 of each vertical raceway 115, 117 are positioned adjacent to each other such that their hollow cores 187 are substantially adjacent to, and in parallel with, each other, and their respective access openings 189 face the same direction.

Figure 8:
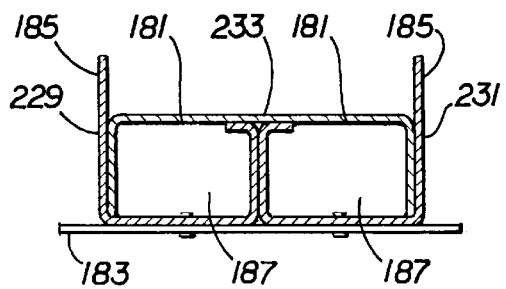
FIG. 8 is a cross-sectional view illustrating the construction of a vertical raceway suitable for use in accordance with the preferred embodiments of the present invention.
Figure 10:
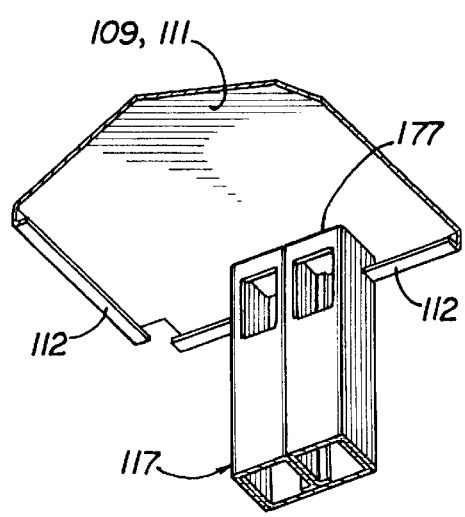
FIG. 10 is a fragmentary perspective bottom view of the relationship between a separation panel and a vertical raceway.

One type of vertical raceway construction, suitable for use with the present invention, is next described. As shown in FIG. 8, each vertical raceway 115, 117 may be formed from three metal sheet members 229, 231, 233. The first and second sheet members 229, 231 may each be used to form one of the cabling flanges 185 and part of the body of one of the tubular members 181. The third sheet member 233 may be used to form the remainder of both tubular members 181. Preferably, the first and second sheet members 229, 231 may be welded to each other and to the third sheet member 233 to produce the desired component. However, it should be clear to one of ordinary skill in the art that other suitable construction means may be used to produce the desired component.

The length of each vertical member 115, 117 may be subdivided into three segments of approximately equal length. The access openings 189 in the first vertical raceway 115 are located near the ends of the centermost segment. Significantly, the access openings 189 of the second vertical raceway 117 are located near the ends of one of the other two segments.

The mounting brackets 183 are attached to the sides of the vertical raceways 115, 117 at specific locations along the length of the raceways 115, 117. In a preferred embodiment, the brackets 183 are riveted to the same side of the raceways 115, 117 as the access openings 189, and at precise locations along the length of the raceways 115, 117, for reasons that will become apparent below.

The cabling flanges 185 are also formed from one or more sheet of metal which extend perpendicularly from the edges of the opposite side of each vertical raceway from the access openings 189 and the mounting brackets 183. In a preferred embodiment, the cabling flanges 185 of each vertical raceway 115, 117 may be either integrally formed with the tubular members 181 or welded to the tubular members 181, or a combination, to produce the desired component. One construction for the cabling flanges 185, suitable for use with the present invention, was described previously. Preferably, the lengths of the cabling flanges 185 are somewhat less than those of the tubular members 181 from which they extend in order to avoid interfering with the side cross members 133 of the external frame 103 when installed therein. Also, the cabling flanges 185 further comprise a plurality of cabling apertures which may be used to attach cabling rings or the like (not shown) to the vertical raceways 115, 117.

Figure 9:
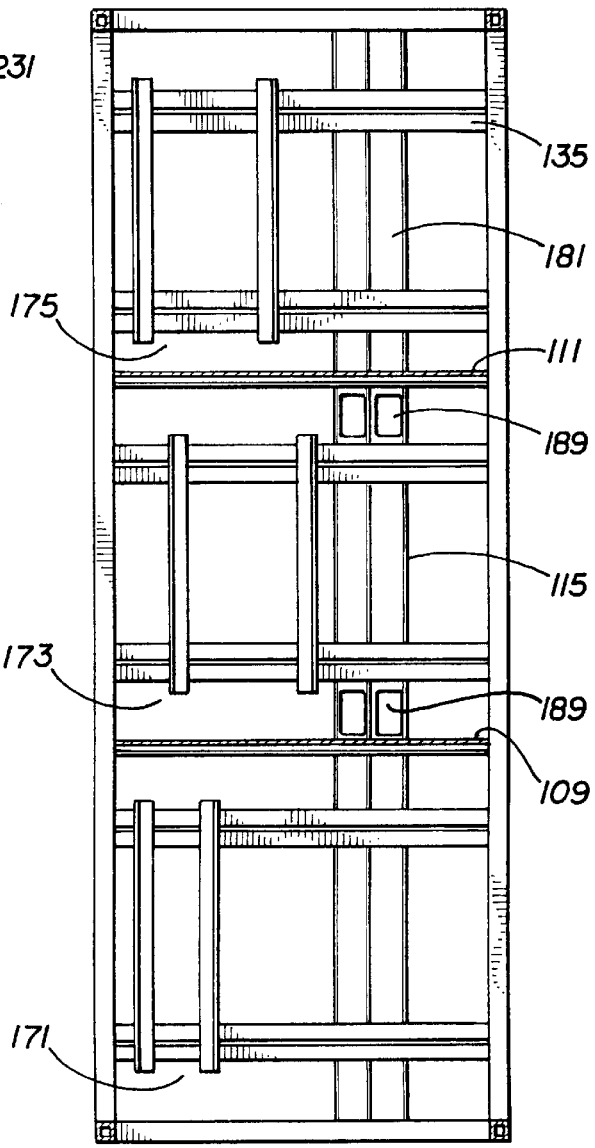
FIG. 9 is a cross-sectional view of the interior of the left side of the cabinet of FIG. 2 illustrating the installation of the first vertical raceway, in accordance with the preferred embodiments of the present invention.

The vertical raceways 115, 117 may be mounted within the cabinet 101 by attaching the raceway mounting brackets 183 on each vertical raceway 115, 117 to the outboard sides 135B of corresponding horizontal mounting rails 135 using suitable fasteners. As described previously, the raceway mounting brackets 183 were affixed to specific locations along the vertical raceways 115, 117, thus enabling each mounting bracket 183 to be secured to one of the horizontal mounting rails 135. The first vertical raceway 115 may be mounted on one side of the cabinet 101 while the second vertical raceway 117 may be mounted on the opposite side of the cabinet. FIG. 9 is a cross-sectional view of the interior of the left side of the cabinet of FIG. 2 illustrating the installation of the first vertical raceway 115, in accordance with the preferred embodiments of the present invention. The first raceway 115 extends through the first recesses 177 in the separation panels 109, 111, and the second raceway 117 extends through the second recesses 179 in the separation panels 109, 111. The lateral position of each raceway 115, 117, relative to the front or rear of the cabinet 101, is thus controlled by the positions of the recesses 177, 179 in the first and second separation panels 109, 111, which are in turn controlled by whether the separation panels are to be installed with the recesses nearer the front or nearer of the rear of the cabinet 101. By mounting the vertical raceways 115, 117 on the outboard sides 135B of the horizontal mounting rails 135, the access openings 189 on each vertical raceway 115, 117 face inward. Because the separation panels 109, 111 partition the interior of the cabinet 101 into three compartments 171, 173, 175 of approximately equal heights, and because the access openings 189 in the first vertical raceway 115 are located in the centermost segment of the first raceway 115, the access openings 189 in the first raceway 115 open into the second compartment 173. Similarly, because the access openings 189 in the second vertical raceway 117 are located in one of the other segments of the second raceway 117, the access openings 189 in the second raceway 117 open into either the first compartment 171 or the third compartment 175, depending on whether the second vertical raceway 117 is installed with its access openings 189 nearer the top or the bottom of the cabinet 101. The installation orientation of the second vertical raceway 117 is, in turn, dependent upon whether cabling to the cabinet 101 is available under the floor of the cabinet's installation location or overhead, for reasons which will become apparent below.

As shown in FIG. 2, the top panel 113 comprises a sheet of metal having at least six punch-out ports 197 and a plurality of vents 199. The top panel 113 may be attached to the top of the external frame 103 via suitable fasteners (not shown). The punch-out ports 197 are arranged so that a port is located directly above each of the four possible positions of the vertical raceways 115, 117. If any overhead cabling must be connected to one or more electronic component within the cabinet 101, then one or more port 197 must be opened or "punched out" to allow cables or wires to descend into one or more compartment 171, 173, 175. Preferably, if overhead cabling is being so utilized, then the second vertical raceway 117 should be installed with its access openings 189 located near the bottom of the cabinet 101 so that the access openings 189 open into the first compartment 171. In such a configuration, cable access from the overhead cabling through the second vertical raceway 117 to the first compartment 171 may be established by punching out the ports 197 directly over the second vertical raceway 117; cable access from the overhead cabling through the first vertical raceway 115 to the second compartment 173 may be established by punching out the ports 197 directly over the first vertical raceway 115; and cable access from the overhead cabling directly to the third compartment 175 may be established by punching out any other ports 197, each of which opens directly into the third compartment 175.

On the other hand, if under-floor cabling is being utilized instead of overhead cabling, then the second vertical raceway 117 should be installed with its access openings 189 located near the top of the cabinet 101 so that the access openings 189 open into the third compartment 175. In such a configuration, cable access from the under-floor cabling to the first compartment 171 is provided directly through the open bottom of the cabinet 101; cable access from the under-floor cabling to the second compartment 173 is provided through the first vertical raceway; and cable access from the under-floor cabling to the third compartment 175 is provided through the second vertical raceway 117.

As shown and described, the cabinet 101 of the present invention comprises three fully enclosed compartments 171, 173, 175, each of which may only be accessed via cable in one of the ways previously described, or by hand through its respective front or rear door 121, 123. The separation panels 109, 111 prevent access through the top or bottom of one compartment 171, 173, 175 to the compartment 171, 173, 175 directly above or below, and the solid walls of the vertical raceways 115, 117 prevent access from any compartment 171, 173, 175 to the cables or wires passing through that compartment 171, 173, 175 within the vertical raceways 115, 117. Preferably, each front and rear door 121, 123 further comprises a lock 166 of a conventional type which may be utilized to lock the respective door 121, 123, thus preventing unauthorized access to the interiors of the respective compartments 171, 173, 175.

For applications in which greater security is desired for the first compartment 171, a bottom panel 114 may optionally be mounted at the bottom of the first compartment 171. Like the top panel 113, the bottom panel 114 may comprise a sheet of metal having at least six punch-out ports (not shown). The bottom panel 114 may be attached to the bottom of the external frame 103 via suitable fasteners (not shown). The punch-out ports are arranged so that a port is located directly below each of the four possible positions of the vertical raceways 115, 117. If any under-floor cabling must be connected to one or more electronic component within the cabinet 101, then one or more port must be opened or "punched out" to allow cables or wires to ascend into one or more compartment 171, 173, 175. As described previously, preferably, if under-floor cabling is being utilized, then the second vertical raceway 117 should be installed with its access openings 189 located near the top of the cabinet 101 so that the access openings 189 open into the third compartment 171. In such a configuration, cable access from the under-floor cabling to the first compartment 171 is provided directly through the open bottom of the cabinet 101; cable access from the under-floor cabling to the second compartment 173 is provided through the first vertical raceway; and cable access from the under-floor cabling to the third compartment 175 is provided through the second vertical raceway 117.

The plurality of vents 199 in the top panel 113 is provided to enable the interior of the cabinet 101 to be ventilated. Heated air from the interior of the cabinet 101 may ascend to the top of the third compartment 175 and from there may escape to the exterior through the vents. Heated air from the first and second compartments 171, 173 may ascend through the perforations in the first and second separation panels 109, 111 into the third compartment 175, and from there may escape to the exterior through the vents as described previously.

For applications in which additional ventilation is desired, a top fan assembly 203 may be mounted on the top of the cabinet 101. The top fan assembly 203 comprises at least one mounting plate 205, one or more conventional fans 207 of a readily available commercial type and a pair of conventional fan guards 208 for each fan 207. A top fan assembly 203 suitable for use with the present invention is the MegaFrame Fan Kit, part no. 12480-701, available from Chatsworth Products, Inc., of Chatsworth, Calif. Each fan 207 may be attached to a mounting plate 205 via suitable fasteners (not shown). The mounting plate 205 may be attached to the top panel 113 via suitable fasteners 214. The fans 207 are arranged so that each fan 207 is positioned directly above one or more vents 199 in the top panel 113. When activated, the fans 207 help to draw heated air from the interior of the cabinet 101 through the vents 199 to the cabinet exterior. The fans aid in the creation of a draft from the first compartment 171 through the perforations in the first separation panel 109 and into the second compartment 173, from the second compartment 173 through the perforations in the second separation panel 111 and into the third compartment 175, and from the third compartment 175 through the vents 199 to the exterior of the cabinet 101 as previously described.

Figure 11:
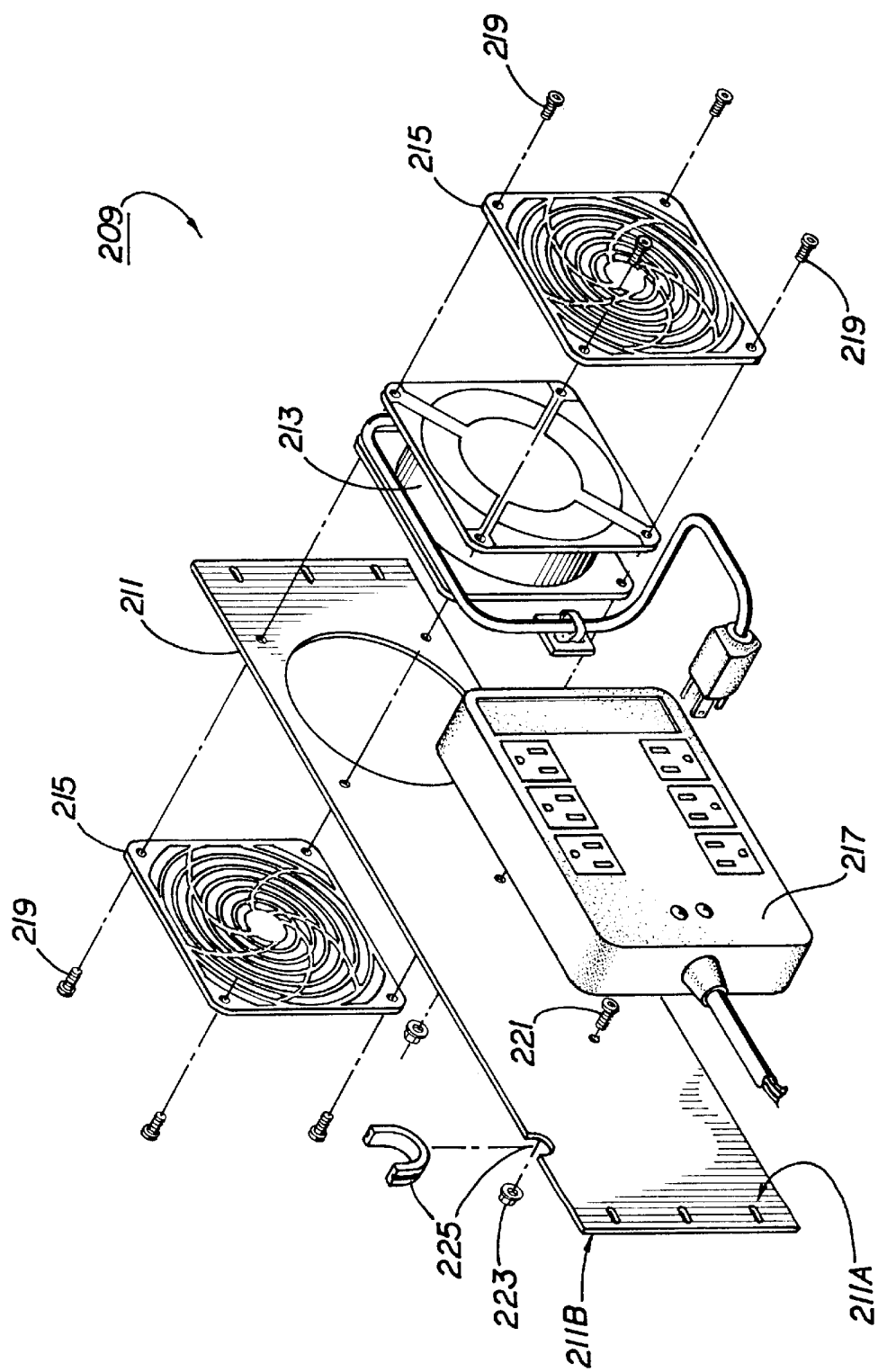
FIG. 11 is an exploded view of a rear fan assembly suitable for use in accordance with the preferred embodiments of the present invention.

In a preferred embodiment, additional ventilation may be provided to each compartment 171, 173, 175 by mounting a rear fan assembly 209 in the rear of each compartment 171, 173, 175. The use of such a fan assembly is particularly critical in cabinets which utilize separation panels which are non-perforated and non-ventilated. FIG. 11 is an exploded view of a rear fan assembly suitable for use in accordance with the preferred embodiments of the present invention. Each rear fan assembly 209 comprises a mounting panel 211, a conventional fan 213 of a readily available commercial type and a pair of conventional fan guards 215 for the fan 213. Preferably, each rear fan assembly 209 further comprises a power strip 217 having multiple conventional three-prong power outlets and a supply cord. A rear fan assembly 209 suitable for use with the present invention is the MegaFrame Rear Fan Kit available from Chatsworth Products, Inc., of Chatsworth, Calif. The mounting panel 211 comprises an inboard side 211A and an outboard side 211B. The fan 213 and fan guards 215 may be attached to the inboard side 211A of the mounting panel 211 and to each other by inserting suitable fasteners 219 through apertures in the fan guards 215 and mounting panel 211 and into corresponding threaded apertures in the fan 213. Advantageously, the power strip 217 may also be attached to the inboard side 211A of the mounting panel 211 by inserting suitable fasteners 221 through apertures in the mounting panel 211 and the power strip 217 and securing them with a hexagonal nut 223. The power supply for the fan 213 may be plugged into one of the available outlets in the power strip 217. The mounting panel 211 further comprises a supply cable retention assembly 225, which includes a notch in the mounting panel 211 and a resilient edge shield mounted within the notch. The power supply for the power strip 217 may be guided through the supply cable retention assembly 225 which functions to hold the power supply cable in place and to prevent damage to the cable insulation, which could be chafed by the edges of the mounting panel 211 if left unprotected.

A first rear fan assembly 209 may be mounted in the rear of the first compartment 171 by attaching the ends of the mounting panel 211 to the vertical mounting rails 137 of the first internal frame 105. Similarly, the second rear fan assembly 209 may be mounted in the rear of the second compartment 173 by attaching the ends of the mounting panel 211 to the vertical mounting rails 137 of the second internal frame 106. Finally, the third rear fan assembly 209 may be mounted in the rear of the third compartment 171 by attaching the ends of the mounting panel 211 to the vertical mounting rails 137 of the third internal frame 107. Preferably, the mounting panels 211 are each oriented so that the inboard side 211A of the mounting panel faces forward and the outboard side 211B of the mounting panel faces rearward. Each mounting panel 211 may be secured by inserting threaded fasteners (not shown) through apertures in the mounting panel 211 into selected apertures in the vertical mounting rails 137.

In combination, the elements of the fan 213, the power strip 217 and the supply cable retention assembly 225 all being mounted together on the mounting panel 211 enable each rear fan assembly 209 to fit into a much more compact space in the rear of each compartment 171, 173, 175 than if the elements were mounted separately. Furthermore, by mounting a mounting panel 211 behind each component to the vertical mounting rails 137 at the rear of each compartment 171, 173, 175, the rear fan assembly utilizes space in the compartment that might otherwise be wasted.

In use, a first server may be installed in the first compartment 171 by opening the front and/or rear door 121, 123 of the first compartment 171 and mounting the first server and any related equipment to the vertical mounting rails 137 of the first internal frame 105 in a conventional manner. The first server may be attached to the vertical mounting rails 137 by inserting fasteners through selected apertures 138 in the vertical mounting rails 137 and through corresponding apertures in the first server, in a mounting chassis affixed to the first server, or in a shelf or set of brackets attached to the vertical mounting rails 137 for the purpose of supporting the first server. Appropriate cables and wires may be connected to input/output connections in the first server or its related equipment. If an overhead cabling system is utilized, then any cables which are to be connected externally may be fed into a convenient access opening 189 in the second vertical raceway 117, which is installed with its access openings 189 positioned in the first compartment 171. In a preferred method of routing the cables, cables which carry data may be routed into one of the tubular members 181 of the second vertical raceway 117, while cables which are used to supply power may be routed into the other tubular member 181 of the second vertical raceway 117. However, it should be clear to one of ordinary skill that the tubular members 181 may be used in any way desired by the owner of the first server. Once inside the second vertical raceway 117, the cables may be routed upward. The punch-out port or ports 197 in the top panel 113 which are directly above the open ends 186 of the second vertical raceway 117 may be removed in order to allow the cables from the first compartment 171 to access the overhead cabling system, which is of conventional design. If, on the other hand, under-floor cabling is utilized, then any cables which are to be connected externally may be fed through the open bottom of the cabinet 101, or, if a bottom panel 114 is utilized, through one or more suitable bottom panel punch-out port. When installation is complete, the doors 121, 123 may be closed and locked to prevent unauthorized physical or visual intrusion.

Further, a second server may be installed in the second compartment 173 by opening the front and/or rear door 121, 123 of the second compartment 173 and mounting the second server and any related equipment to the vertical mounting rails 137 of the second internal frame 106 in a conventional manner. The second server may be attached to the vertical mounting rails 137 by inserting fasteners through selected apertures 138 in the vertical mounting rails 137 and through corresponding apertures in the second server, in a mounting chassis affixed to the second server, or in a shelf or set of brackets attached to the vertical mounting rails 137 for the purpose of supporting the second server. Although in a preferred embodiment the second server may be mounted to the vertical mounting rails, it should be obvious to one of ordinary skill in the art that alternatively, the second server may be installed in the second compartment merely by placing it at rest on the first separator panel 109. Appropriate cables and wires may be connected to input/output connections in the second server or its related equipment. Any cables which are to be connected externally may be fed into a convenient access opening 189 in the first vertical raceway 115. In a preferred method of routing the cables, cables which carry data may be routed into one of the tubular members 181 of the first vertical raceway 115, while cables which are used to supply power may be routed into the other tubular member 181 of the first vertical raceway 115. However, it should be clear to one of ordinary skill that the tubular members 181 may be used in any way desired by the owner of the second server. If overhead cabling is utilized, then once inside the first vertical raceway 115, the cables may be routed upward. The punch-out port or ports 197 in the top panel 113 which are directly above the open ends 186 of the first vertical raceway 115 may be removed in order to allow the cables from the second compartment 173 to access the overhead cabling system described previously. On the other hand, if under-floor cabling is utilized, then once inside the first vertical raceway 115, the cables may be routed downward and through the open bottom of the cabinet 101, or, if a bottom panel 114 is utilized, through one or more suitable bottom panel punch-out port. When installation is complete, the doors 121, 123 may be closed and locked to prevent unauthorized physical or visual intrusion.

Still further, a third server may be installed in the third compartment 175 by opening the front and/or rear door 121, 123 of the first compartment 175 and mounting the third server and any related equipment to the vertical mounting rails 137 of the third internal frame 107 in a conventional manner. The third server may be attached to the vertical mounting rails 137 by inserting fasteners through selected apertures 138 in the vertical mounting rails 137 and through corresponding apertures in the third server, in a mounting chassis affixed to the third server, or in a shelf or set of brackets attached to the vertical mounting rails 137 for the purpose of supporting the third server. Although in a preferred embodiment the third server may be mounted to the vertical mounting rails, it should be obvious to one of ordinary skill in the art that alternatively, the third server may be installed in the third compartment merely by placing it at rest on the second separator panel 111. Appropriate cables and wires may be connected to input/output connections in the third server or its related equipment. If an under-floor cabling system is utilized, then any cables which are to be connected externally may be fed into a convenient access opening 189 in the second vertical raceway 117, which is installed with its access openings 189 positioned in the third compartment 175. In a preferred method of routing the cables, cables which carry data may be routed into one of the tubular members 181 of the second vertical raceway 117, while cables which are used to supply power may be routed into the other tubular member 181 of the second vertical raceway 117. However, it should be clear to one of ordinary skill that the tubular members 181 may be used in any way desired by the owner of the third server. Once inside the second vertical raceway 117, the cables may be routed downward and through the open bottom of the cabinet 101, or if a bottom panel 114 is utilized, then the bottom panel punch-out port or ports which are directly below the open ends 186 of the second vertical raceway 117 may be removed in order to allow the cables from the third compartment 175 to access the under-floor cabling system. If, on the other hand, overhead cabling is utilized, then the cables may be routed upward once inside the second vertical raceway 117. The punch-out port or ports 197 in the top panel 113 which are directly above the open ends 186 of the second vertical raceway 117 may be removed in order to allow the cables from the third compartment 175 to access the overhead cabling system described previously. When installation is complete, the doors 121, 123 may be closed and locked to prevent unauthorized physical or visual intrusion.

A rear fan assembly 209 may be installed in any of the compartments 171, 173, 175 by opening the rear door 123 of the compartment 171, 173, 175 and mounting the rear fan assembly 209 to the vertical mounting rails 137 of the internal frame 105, 106, 107 within that compartment. The rear fan assembly 209 may be attached to the rear pair of vertical mounting rails 137 by inserting fasteners through apertures in the mounting panel 211 and into selected apertures 138 in the rear vertical mounting rails 137. Preferably, the mounting panel 211 is installed such that the inboard side 211A faces the server equipment and the outboard side 211B faces the rear of the compartment 171, 173, 175 so that power supply cables on the server equipment may be easily routed to the power outlets on the power strip 217. Also preferably, the mounting panel 211 is installed at or near the top or the bottom of the compartment 171, 173, 175 so that interference with future access to the server equipment installed within the compartment 171, 173, 175 may be minimized. When installation is complete, the rear door 123 may be closed and locked to prevent unauthorized physical or visual intrusion.

It will therefore be readily understood by those persons skilled in the art that the present invention is susceptible of broad utility and application. Many embodiments and adaptations of the present invention other than those herein described, as well as many variations, modifications and equivalent arrangements, will be apparent from or reasonably suggested by the present invention and the foregoing description thereof, without departing from the substance or scope of the present invention. Accordingly, while the present invention has been described herein in detail in relation to its preferred embodiments, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

What is claimed is:

1. A co-location electronic network component cabinet for securely storing a plurality of active electronic components in isolation from each other, the cabinet being adjacent to a cabling system, and each electronic component having external cables, the cabinet comprising:
   an external frame, the frame having an interior;
   a plurality of panels mounted on the external frame;
   a plurality of vertically arrayed compartments, each compartment being located in the interior of the external frame, and each compartment being defined by at least some of the plurality of panels; and
   at least one raceway mounted substantially within the interior of the external frame, wherein a first raceway of the at least one raceway routes external cables of only a first electronic component toward the cabling system.

2. The cabinet of claim 1, wherein the at least one raceway comprises at least two raceways, and wherein a second raceway routes external cables of only a second electronic component toward the cabling system.

3. The cabinet of claim 1 wherein the first raceway comprises at least one access opening for communicatively connecting the raceway to a first compartment of the plurality of compartments.

4. The cabinet of claim 3 wherein the at least one raceway comprises at least two raceways, and wherein a second raceway comprises an access opening for communicatively connecting the raceway to a second compartment of the plurality of compartments.

5. A co-location electronic network component cabinet for storing a plurality of active electronic components adjacent to a cabling system, the cabinet comprising:
  an external frame, the frame having an interior;
  a plurality of vertically arrayed sub-cabinets, wherein each sub-cabinet comprises:
    an internal frame mounted to the external frame; and
    at least one door;
  at least one separation panel mounted between a first sub-cabinet and a second sub-cabinet; and
  at least one raceway mounted substantially within the interior of the external frame, wherein a first raceway of the at least one raceway routes external cables of only a first electronic component toward the cabling system.

6. The cabinet of claim 5 wherein the at least one raceway comprises at least two raceways, and wherein a second raceway routes external cables of only a second electronic component toward the cabling system.

7. A raceway for protecting cables routed in a co-location server cabinet from unauthorized intrusion, the cabinet having at least two compartments, wherein the raceway comprises:
  at least one tubular member having a generally hollow interior, the tubular member comprising a plurality of segments, each segment corresponding to exactly one of the at least two compartments;
  at least one access opening for communicatively connecting the interior of the tubular member to one of the compartments, each of the access openings being located entirely within the segment corresponding to the compartment;
  at least one open end for communicatively connecting the interior of the tubular member to the exterior of the cabinet, wherein at least one open end communicatively connects the interior of the tubular member to the space above the cabinet, and at least one open end communicatively connects the interior of the tubular member to the space below the cabinet; and
  at least one mounting bracket for mounting the raceway to the cabinet.

8. The raceway of claim 7 wherein all of the plurality of segments are of approximately equal length.

9. A co-location electronic network component cabinet for storing a plurality of active electronic components adjacent to a cabling system, each electronic component having external cables, the cabinet comprising:
  an external frame, the frame having an interior;
  a plurality of vertically arrayed sub-cabinets, wherein each sub-cabinet comprises:
    an internal frame mounted to the external frame; and
    a plurality of panels mounted on the external frame, wherein at least one of the panels is a separation panel mounted between a first sub-cabinet and a second sub-cabinet;
  a plurality of vertically arrayed compartments, each compartment being located in the interior of the external frame, each compartment being defined by at least some of the plurality of panels, each compartment corresponding to at least one sub-cabinet, and each compartment being isolated from at least one other compartment by a separation panel, and wherein an active electronic component is installed within each compartment;
  at least one raceway mounted substantially within the interior of the external frame, wherein each of the at least one raceway routes external cables of only one electronic component to the cabling system; and
  at least one fan assembly mounted within at least a first compartment of the plurality of compartments, the fan assembly being mounted adjacent to the electronic component installed within the first compartment.

* * * * *